US006850444B2

(12) United States Patent
Cho

(10) Patent No.: US 6,850,444 B2
(45) Date of Patent: Feb. 1, 2005

(54) DATA INPUT DEVICE OF A DDR SDRAM

(75) Inventor: Ho Youb Cho, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/670,613

(22) Filed: Sep. 25, 2003

(65) Prior Publication Data

US 2004/0257881 A1 Dec. 23, 2004

(30) Foreign Application Priority Data

Jun. 18, 2003 (KR) ................................ 10-2003-0039506

(51) Int. Cl.[7] .................................................. G11C 7/22

(52) U.S. Cl. .................. 365/189.05; 365/193; 365/233; 365/189.02

(58) Field of Search ............................ 365/189.05, 193, 365/233, 189.02

(56) References Cited

U.S. PATENT DOCUMENTS 6,512,719 B2 * 1/2003 Fujisawa et al. ............ 365/233
6,639,868 B2 * 10/2003 Kim et al. .................. 365/233
6,671,211 B2 * 12/2003 Borkenhagen et al. . 365/189.05

* cited by examiner

*Primary Examiner*—Richard Elms
*Assistant Examiner*—J. H. Hur
(74) *Attorney, Agent, or Firm*—Ladas & Parry LLP

(57) ABSTRACT

A data input device of a DDR SDRAM includes at least a clock pulse generator (for outputting a data-in-strobe signal based on internal clock), first and second data buffers (being controlled by the data-in-strobe signal and having output lines corresponding to first and second global input-output lines, respectively). When a second control signal is low, the first data is directly applied to the first data buffer for transfer to the first global input/output line, and the second data is directly applied to the second data buffer for transfer to the second global input/output line. When the second control signal is high, the first data is directly applied to the second data buffer for transfer to the second global input/output line, and the second data is directly applied to the first data buffer for transfer to the first global input/output line. The time for the write operation is reduced by directly applying the write-in-strobe signal to the data buffers.

5 Claims, 10 Drawing Sheets

DATA INPUT DEVICE OF A DDR SDRAM

BACKGROUND OF THE INVENTION

1. Field of the Invention

The present invention relates to a data input device of a semiconductor memory device, and more particularly to a data input device of a DDR SDRAM.

2. Description of the Prior Art

As generally known in the art, a DDR SDRAM is a memory device which inputs and outputs data by synchronizing the data with a rising edge and a falling edge of a clock signal, and is provided with a data input device and a data output device which operate in synchronization with the rising edge and the falling edge of the clock signal.

FIG. 1 is a block diagram of a related art data input device of a DDR DRAM.

Referring to FIG. 1, the related art data input device includes a clock pulse generator 100, an even strobe signal generator 110, an odd strobe signal generator 111, a first data buffer 120, and a second data buffer 121. FIG. 2*a* illustrates an example of the construction of the data buffer 120 or 121, and FIG. 2*b* illustrates an example of the construction of the strobe signal generator 110 or 111, the construction of which is well known in the art.

The clock pulse generator 100 receives a clock signal clk_din, which operates in a write mode, and generates a strobe signal dinstb, which is a control signal for transferring data to be written to a global data line. That is, the clock pulse generator 100 generates the strobe signal dinstb for strobing the data to be written, and as shown in FIG. 3, it receives the clock signal clk_din and outputs the strobe signal dinstb in the form of a pulse synchronized with the rising edge of the clock signal clk_din. For reference, the clock signal clk_din is an internal clock for the data input, which operates in the write mode.

'LAT_SOSEZ' denotes the strobe signal generator 110 or 111, which generates the strobe signal according as whether a start address during a write command is even or odd. Here, if a value of the least significant bit (LSB) of the start address is "0", the start address is an even address, while if the LSB is "1", the start address is an odd address. For reference, the start address is a column address, which is inputted during a burst write operation.

The input signal soseb_wt applied to the strobe signal generators 110 and 111 is in a "LOW" state if the start address is an even address, and in a "HIGH" state if the start address is an odd address. For reference, in the input signal soseb_wt, 'soseb' is an abbreviation of "start address odd start address even bar", and 'wt' is an abbreviation of "write". The input signal seseb_wt is a signal used during the write operation.

In the case that the start address is an even address, the input signal soseb_wt becomes "LOW", and the even strobe signal generator 110 outputs a first control signal dinstb_ev. Here, the first control signal dinstb_ev represents a signal of even data in strobe.

In the case that the start address is an odd address, the input signal soseb_wt becomes "HIGH", and the even strobe signal generator 111 outputs a second control signal dinstb_od. Here, the second control signal dinstb_od represents a signal of odd data in strobe.

Then, the three signals, e.g., the data-in-strobe signal dinstb, first and second control signals dinstb_EV and dinstb_od are OR-gated, and an OR-gated output signal dinstb_pcg is applied to the data buffers 120 and 121. For reference, the signal dinstb_pcg is a pre-charge signal of the data buffer 120 or 121.

Accordingly, if any one of the three signals is in a high level, i.e., in an enable state, the data buffers 120 and 121 normally operate, while if all the three signals are in a low level, i.e., in a disabled state, the data buffers 120 and 121 are in a pre-charge state.

The first and second control signals dinstb_ev and dinstb_od are applied to the data buffers 120 and 121. Here, the data buffers 120 and 121 are denoted as DIN_IOSA, and transfer the data stored in the data buffers 120 and 121 to the global input/output lines gio_ev and gio_od of the memory device in accordance with the first and second control signals dinstb_ev and dinstb_od.

Then, the data dinr is applied to the data input buffer 120 and the data dinf is applied to the data input buffer 121. Generally, in the DDR SDRAM, the data is inputted along with DQS. At this time, the rising data of the DQS is denoted as 'dinr', and the falling data of the DQS is denoted as 'dinf'. For example, if the burst length is 4 and four data Q0, Q1, Q2 and Q3 are applied, 'dinr' represents Q0 and Q2 and 'dinf' represents Q1 and Q3.

In operation, if the start address applied during the write operation is an even address, the rising data dinr inputted in synchronization with the rising edge of the clock signal is applied to the first data input buffer 120, and then transmitted to the global input/output line gio_ev. Also, the falling data dinf inputted in synchronization with the falling edge of the clock signal is applied to the second data input buffer 121, and then transmitted to the global input/output line gio_od.

However, if the start address applied during the write operation is an odd address, the rising data dinr inputted in synchronization with the rising edge of the clock signal is applied to the second data input buffer 121, and then transmitted to the global input/output line gio_od. Also, the falling data dinf inputted in synchronization with the falling edge of the clock signal is applied to the first data input buffer 120, and then transmitted to the global input/output line gio_ev.

For example, it is assumed that the burst length is 4.

In the DDR SDRAM, if the data Q0, Q1, Q2 and Q3 are sequentially inputted in the write mode, the data inputted in synchronization with the rising edge of the first clock signal, which is for synchronizing the data input/output, is "Q0", and the data inputted in synchronization with the falling edge of the first clock signal is "Q1". The data inputted in synchronization with the rising edge of the second clock signal is "Q2", and the data inputted in synchronization with the falling edge of the second clock signal is "Q3".

At this time, if the value of the LSB of the column address inputted for the burst operation is "0", the data "Q0" is applied to the first data input buffer 120, and then transmitted to the global input/output line gio_ev. The data "Q1" is applied to the second data input buffer 121, and transmitted to the global input/output line gio_od. Also, the data "Q2" is applied to the first data input buffer 120, and then transmitted to the global input/output line gio_ev. The data "Q3" is applied to the second data input buffer 121, and transmitted to the global input/output line gio_od.

That is, if the value of the LSB of the column address inputted for the burst operation is "0", the data "Q0" and "Q2" are inputted to the first data buffer 120, and the data "Q1" and "Q3" are inputted to the second data buffer 121.

On the contrary, if the value of the LSB of the column address inputted for the burst operation is "1", the data "Q0"

is applied to the second data input buffer 121, and then transmitted to the global input/output line gio__od. The data "Q1" is applied to the first data input buffer 120, and transmitted to the global input/output line gio__ev. Also, the data "Q2" is applied to the second data input buffer 121, and then transmitted to the global input/output line gio__od. The data "Q3" is applied to the first data input buffer 120, and transmitted to the global input/output line gio__ev.

That is, if the value of the LSB of the column address inputted for the burst operation is "1", the data "Q0" and "Q2" are inputted to the second data buffer 121, and the data "Q1" and "Q3" are inputted to the first data buffer 120.

The above-described operation will now be explained in more detail with reference to FIG. 3.

In FIG. 3, as described above, if the signal soseb__wt is in a "LOW" state, this indicates that the start address is an even address, and if the signal soseb__wt is in a "HIGH" state, this indicates that the start address is an odd address.

As shown in FIG. 3, if the signal soseb__wt is in the low level, the rising data dinr is transferred to the even global input/output line gio__ev after a predetermined time elapses, and the falling data dinf is transferred to the odd global input/output line gio__od after a predetermined time elapses.

However, if the signal soseb__wt is in the high level, the rising data dinr is transferred to the odd global input/output line gio__od after the predetermined time elapses, and the falling data dinf is transferred to the even global input/output line gio__ev after the predetermined time elapses.

As described above, in the related art, in order to receive the even data and the odd data, the data-in-strobe signal dinstb is separated into the even signal and the odd signal (e.g., the first and second control signals).

Also, a separate signal dinstb__pcg for pre-charging the data input buffer 120 or 121 is used. Also, the strobe signal generators 110 and 111 receive the data-in-strobe signal dinstb and the signal soseb__wt, and generate the first and second control signals.

At this time, if the start address is an even address during the write operation, the signal soseb__wt is in a low level, and this causes the first control signal dinstb__ev to be enabled and the second control signal__dinstb__od to be kept in a low level.

However, if the start address is an odd address during the write operation, the signal soseb__wt is in a high level, and this causes the first control signal dinstb__ev to be kept in a low level and the second control signal dinstb__od to be enabled.

In operation, if the first control signal dinstb__ev is enabled, the rising data dinr is transferred to the global input/output line gio__ev, and the falling data is transferred to the global input/output line gio__od.

On the contrary, if the second control signal dinstb__od is enabled, the rising data dinr is transferred to the global input/output line gio__od, and the falling data is transferred to the global input/output line gio__ev.

The related art data input device illustrated in FIG. 1, however, has the following problems:

1) Since the signals of data in strobe dinstb are applied to the data input buffers 120 and 121 after being converted into the first and second control signals through the strobe signal generators 110 and 111, the timing of the signals is delayed and thus the time required for the write operation is lengthened.

2) Due to the strobe signal generators 110 and 111 for generating the first and second control signals and the OR gate for generating the pre-charge signal dinstb__pcg, the power consumption increases and the loss of layout is produced.

SUMMARY OF THE INVENTION

Accordingly, the present invention has been made to solve the above-mentioned problems occurring in the related art, and an object of the present invention is to provide a data input device of a DDR SDRAM which can reduce the time required for the write operation in the DDR SDRAM.

For this, the present invention proposes a method of directly using a data-in-strobe signal.

Another object of the present invention is to provide a data input device of a DDR SDRAM which can reduce a power consumption and a layout area by removing strobe signal generators 110 and 111 which occupy a large installation area.

In order to accomplish these objects, there is provided a data input device of a DDR SDRAM comprising a clock pulse generator for receiving an internal clock, which operates in a write mode, and outputting a data-in-strobe signal that is a first control signal, a first data buffer an operation of which is controlled by the data-in-strobe signal and an output line of which corresponds to a first global input/output line of the DDR SDRAM, and a second data buffer an operation of which is controlled by the data-in-strobe signal and an output line of which corresponds to a second global input/output line of the DDR SDRAM, wherein if a second control signal is at a low level, first data is directly applied to the first data buffer to be transferred to the first global input/output line, and second data is directly applied to the second data buffer to be transferred to the second global input/output line, while if the second control signal is in a high level, the first data is directly applied to the second data buffer to be transferred to the second global input/output line, and the second data is directly applied to the first data buffer to be transferred to the first global input/output line.

In the present invention, the second control signal outputs a low level if the least significant bit (LSB) of a column address applied in the write mode is "0", and outputs a high level if the LSB of the column address is "1".

In the first embodiment of the present invention, the first data buffer selectively receives the first data or the second data through one input terminal.

In the second embodiment of the present invention, the first data buffer selectively receives the first data or the second data through two input terminals.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
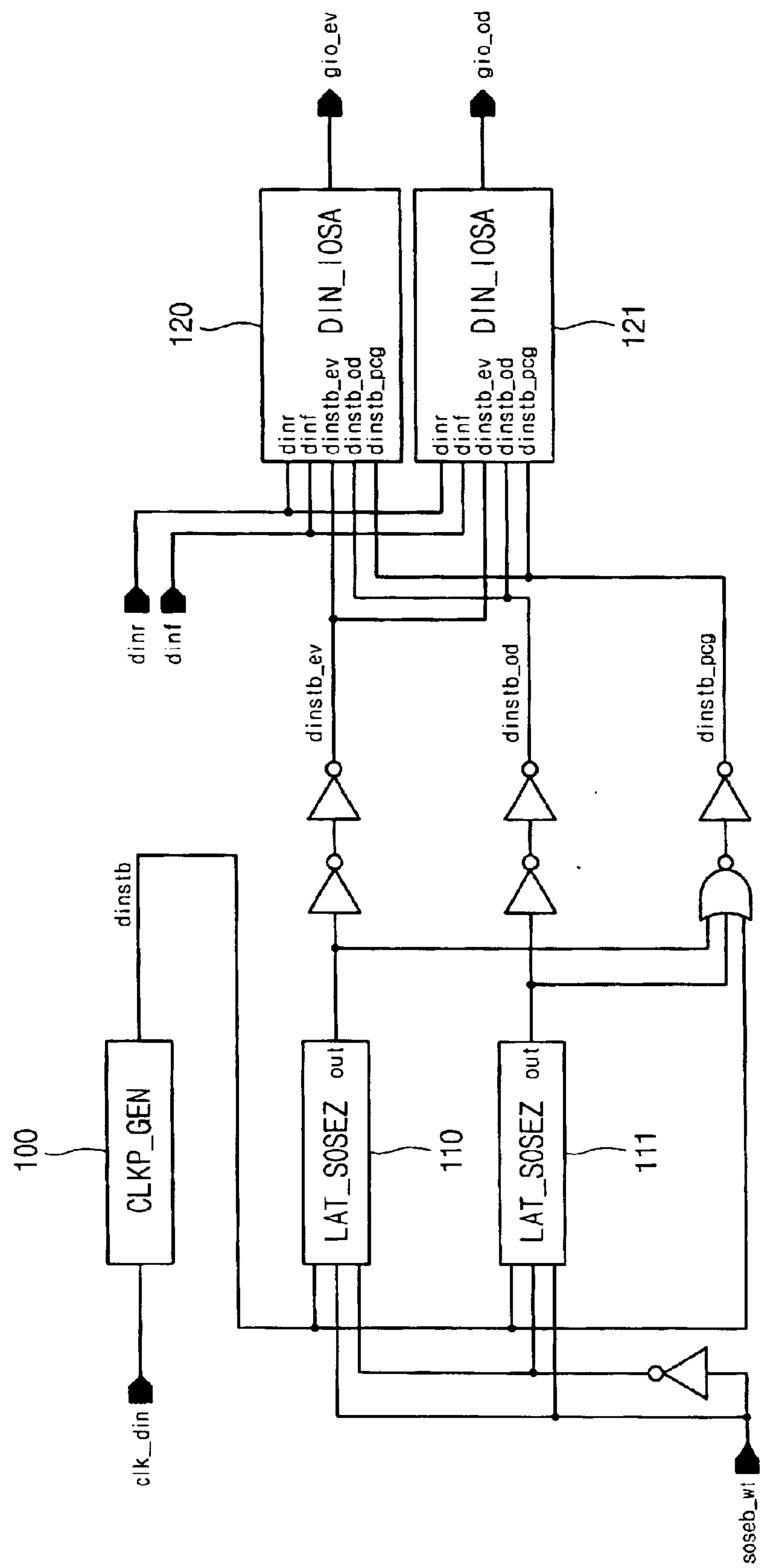
FIG. 1 is a block diagram of a related art data input device of a DDR DRAM.
Figure 2A:
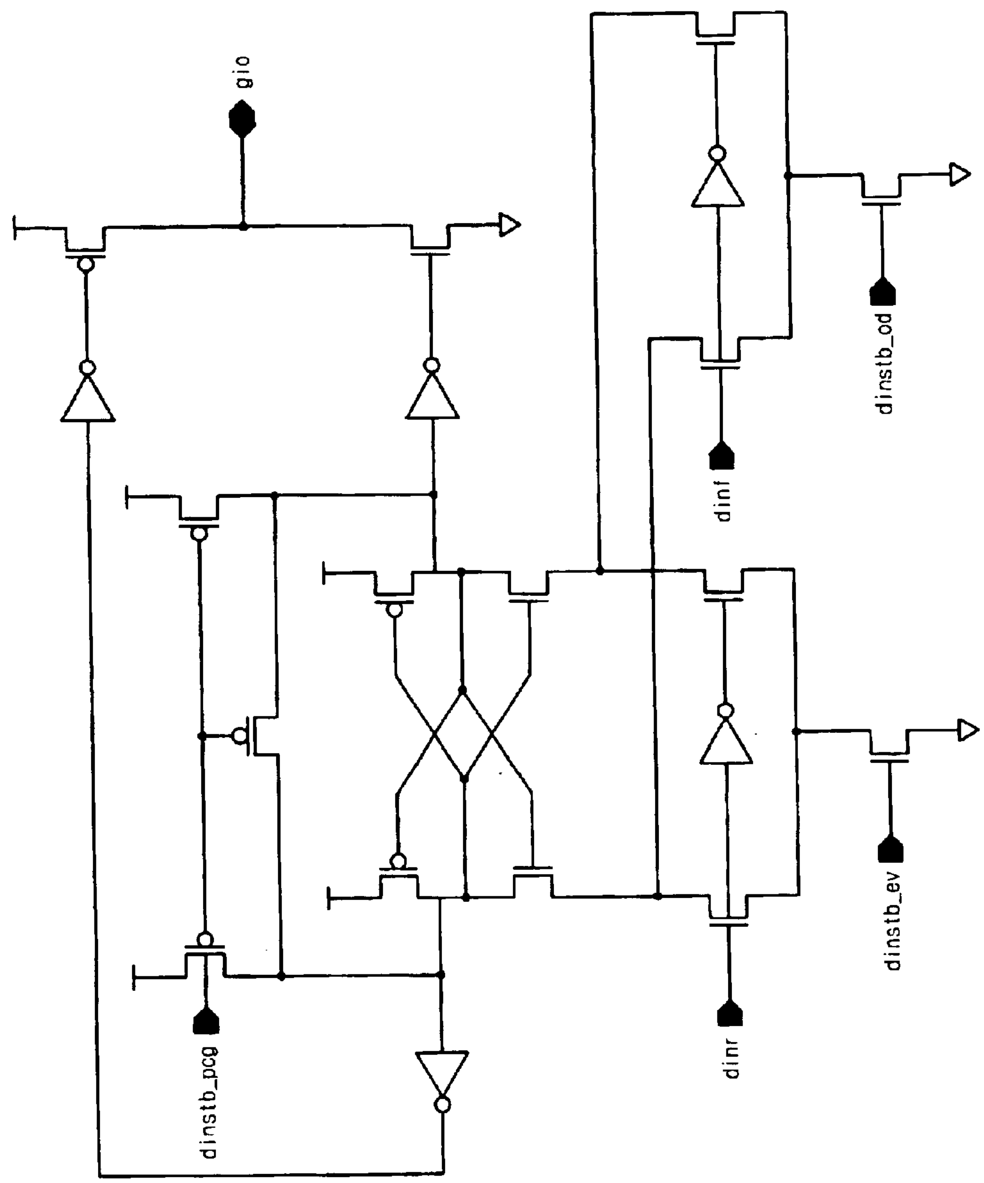
FIG. 2*a* is a circuit diagram illustrating an example of the construction of the data buffer illustrated in FIG. 1.
Figure 2B:
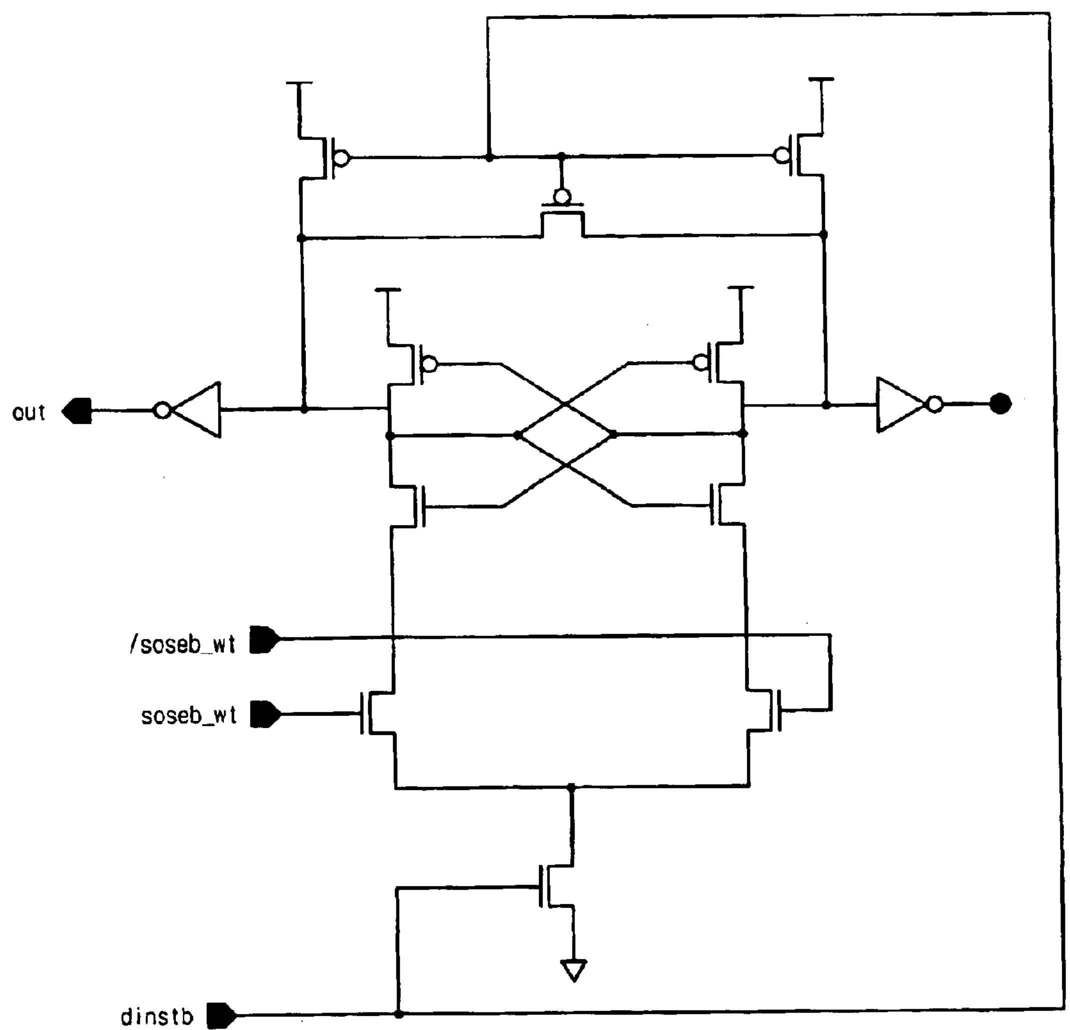
FIG. 2*b* is a circuit diagram illustrating an example of the construction of the strobe signal generator illustrated in FIG. 1.

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 4:
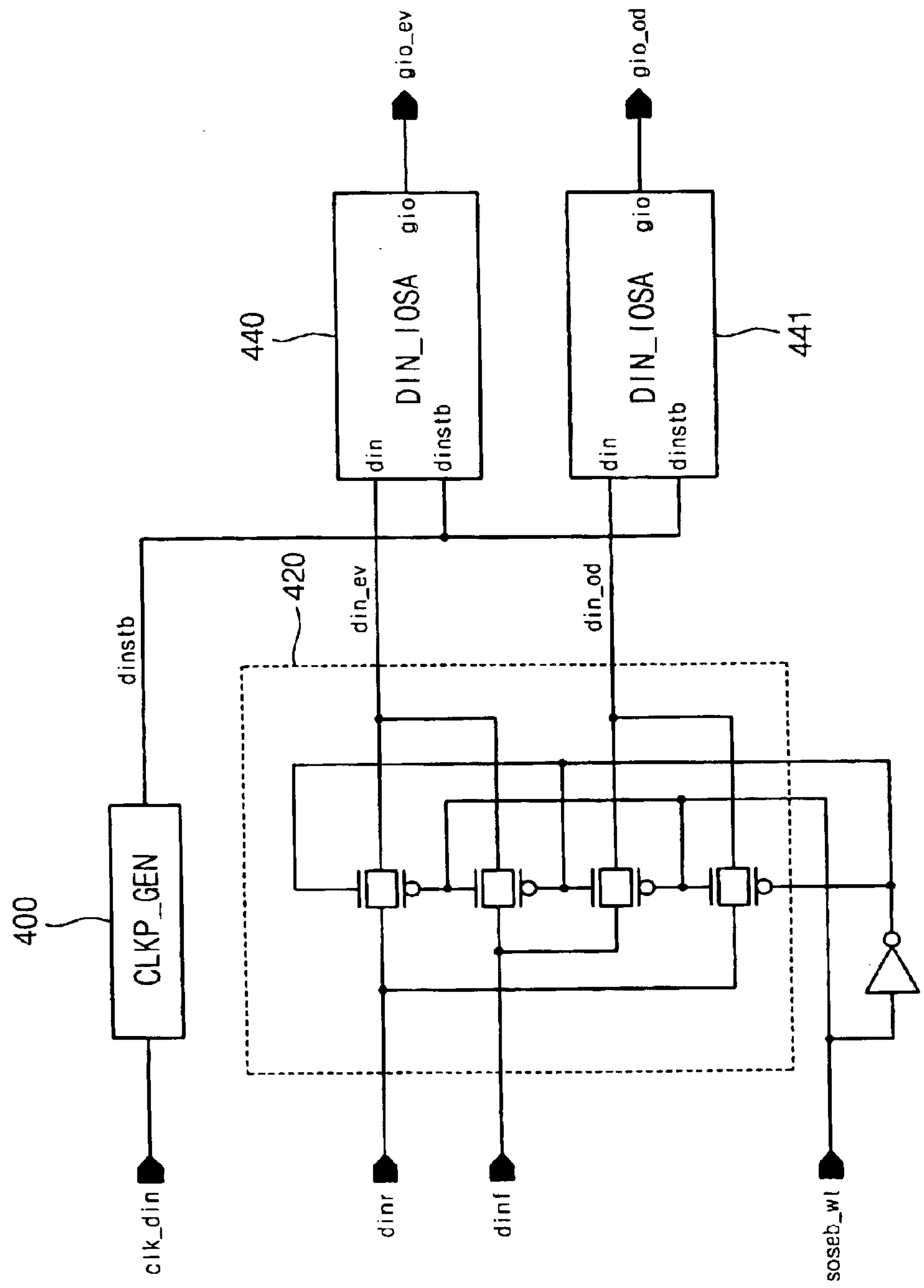
FIG. 4 is a block diagram of a data input device of a DDR SDRAM according to a first embodiment of the present invention.

FIG. 4 is a block diagram of a data input device of a DDR SDRAM according to a first embodiment of the present invention.

As shown in FIG. 4, the data input device according to the first embodiment of the present invention includes a clock pulse generator 400, a multiplexer. 420, and data buffers 440 and 441.

The clock pulse generator 400 generates a strobe signal for strobing data dinr and dinf being written, and comprises a delay adjustment unit for adjusting a strobe timing and a pulse width adjustment unit for adjusting a pulse width. The clock pulse generator 400 is the same as the related art clock pulse generator illustrated in FIG. 1. Thus, the input signal of the clock pulse generator 400 is clk_din and the output signal is dinstb, which are the same as those in FIG. 1.

The multiplexer 420 multiplexes external input rising data dinr and falling data dinf in accordance with a start address during a write operation, and outputs corresponding even data din_ev and odd data din_od. Here, a control signal of the multiplexer is soseb_wt. That is, if the control signal soseb_wt is "LOW", the rising data dinr is transferred to the din_ev, and the falling data dinf is transferred to the din_od. Also, if the control signal is "HIGH", the rising data dinr is transferred to the din_od, and the falling data dinf is transferred to the din_ev.

The data buffers 440 and 441 are controlled by the signal dinstb outputted from the clock pulse generator 400. The data buffers 440 and 441 receive the even data din_ev and the odd data din_od outputted from the multiplexer 420, and transfer the even data din_ev and the odd data din_od to the global input/output lines gio_ev and gio_od, respectively. That is, if the signal dinstb is enabled, the even data din_ev is transferred to the even global input/output line gio_ev, and the odd data din_od is transferred to the odd global input/output line gio_od. Accordingly, during the write operation in the case that the start address is an even address, the rising data dinr is transferred to the even global input/output line gio_ev, and the falling data dinf is transferred to the odd global input/output line gio_od. However, during the write operation in the case that the start address is an odd address, the rising data dinr is transferred to the odd global input/output line gio_od, and the falling data dinf is transferred to the even global input/output line gio_ev. For reference, in the case that the data-in-strobe signal is in a disabled state, the data buffers 440 and 441 are kept in a pre-charge state.

As explained with reference to FIG. 1, if the start address is the even address during the write operation, the control signal soseb_wt becomes "LOW", and thus among the data Q0, Q1, Q2 and Q3, the data Q0 and Q2 are carried on the rising data and finally applied to the data buffer 440, while the data Q1 and Q3 are carried on the falling data and finally applied to the data buffer 441.

On the contrary, if the start address is the odd address, the control signal soseb_wt becomes "HIGH", and thus among the data Q0, Q1, Q2 and Q3, the data Q0 and Q2 are carried on the rising data and finally applied to the data buffer 441, while the data Q1 and Q3 are carried on the falling data and finally applied to the data buffer 440.

Here, if the start address is the even address during the write operation, the rising data dinr is first transferred to the even data din_ev, and then the falling data dinf is transferred to the odd data din_od.

However, if the start address is the odd address during the write operation, the fall data dinf is first transferred to the odd data din_od, and then the rising data dinr is transferred to the even data din_ev.

Figure 5:
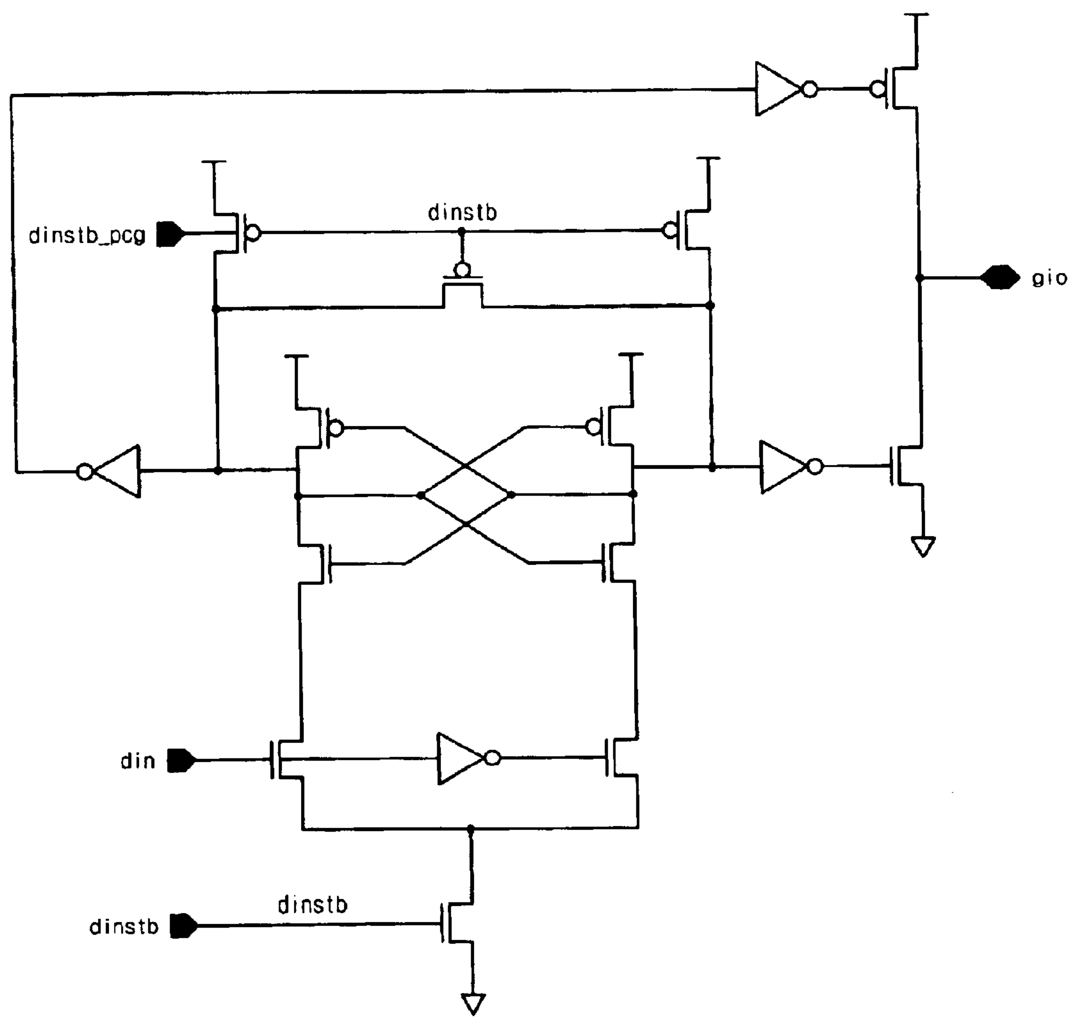
FIG. 5 is a circuit diagram illustrating the construction of the data buffer illustrated in FIG. 4.

FIG. 5 is a circuit diagram illustrating the construction of the data buffer illustrated in FIG. 4. As illustrated in FIG. 5, the data buffer used according to the first embodiment of the present invention is enabled and operates when the data-in-strobe signal dinstb is in the high level. Thus, the rising or falling data inputted to the data buffer is transferred to the global input/output line.

Figure 6:
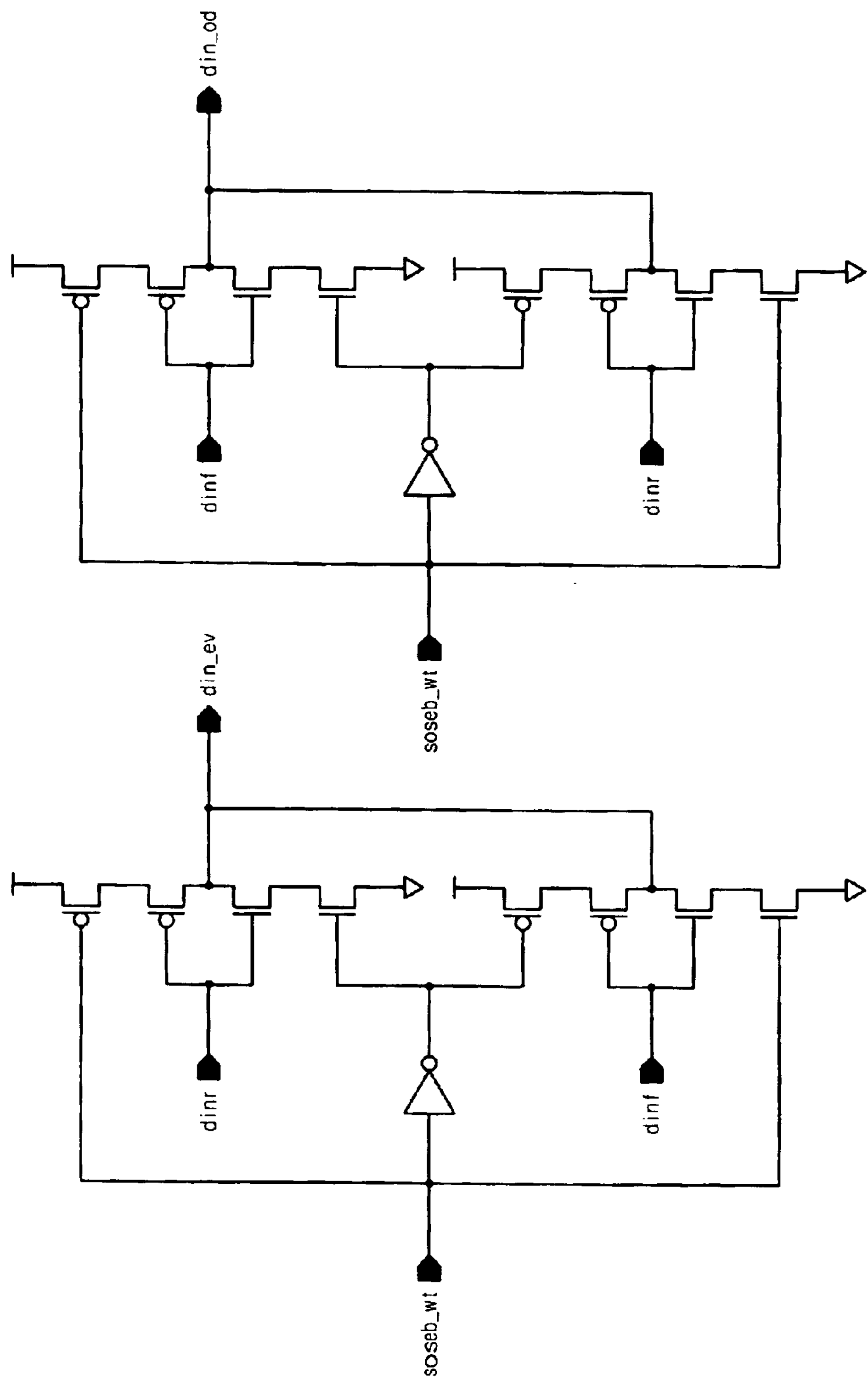
FIG. 6 is a circuit diagram illustrating the construction of the multiplexer illustrated in FIG. 4.

FIG. 6 is a circuit diagram illustrating the construction of the multiplexer illustrated in FIG. 4. It will be apparent to those skilled in the art that various modifications and variation can be made in the present invention without departing from the spirit of scope of the invention.

Figure 7:
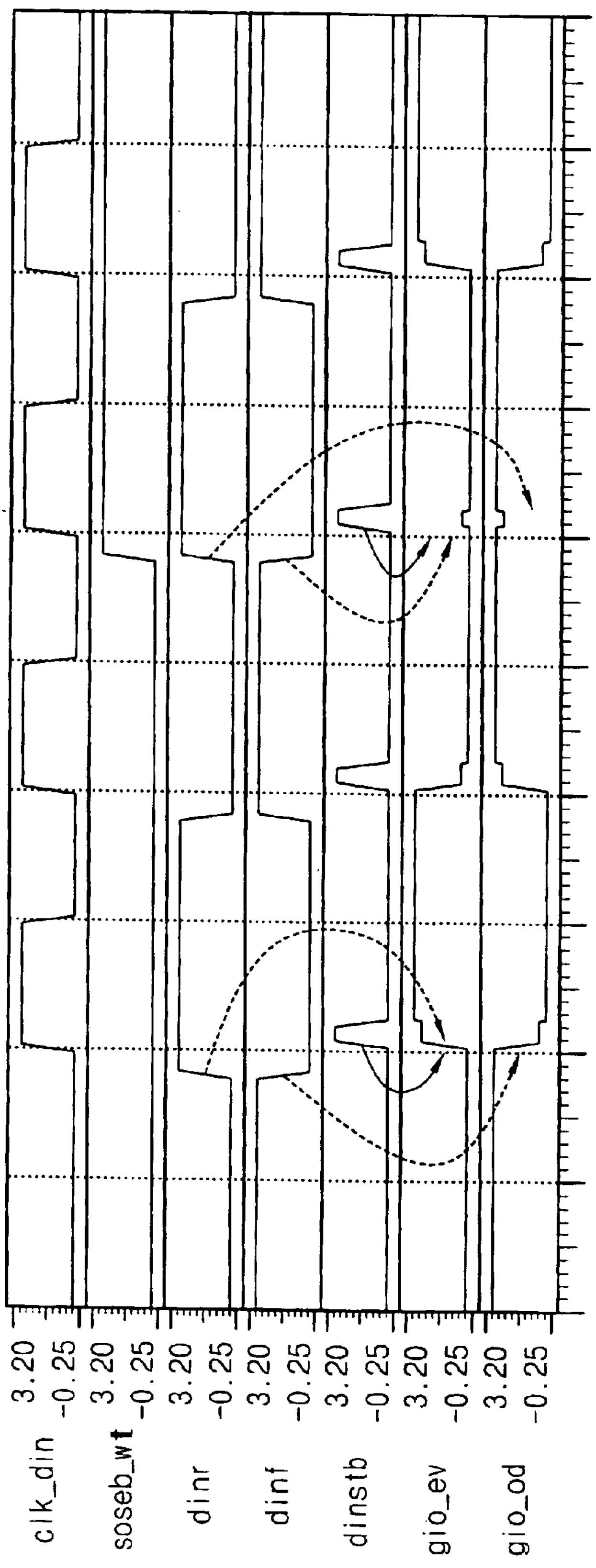
FIG. 7 is a waveform diagram of signals used in the data input device of FIG. 4 according to the first embodiment of the present invention.

FIG. 7 is a waveform diagram of signals used in the data input device of FIG. 4 according to the first embodiment of the present invention.

As shown in FIG. 7, if the control signal soseb_wt is in a low level, the rising data dinr is transferred to the even global input/output line gio_ev after a predetermined time elapses, and the falling data dinf is transferred to the odd global input/output line gio_od after a predetermined time elapses. On the contrary, if the control signal soseb_wt is in a high level, the rising data dinr is transferred to the odd global input/output line gio_od after a predetermined time elapses, and the falling data dinf is transferred to the even global input/output line gio_ev after a predetermined time elapses. In FIG. 7, the basic operation of the data input device according to the first embodiment of the present invention is identical to that according to the related art, but the time required for the input data to be transferred to the global input/output line is shortened in comparison to the related art device.

Figure 8:
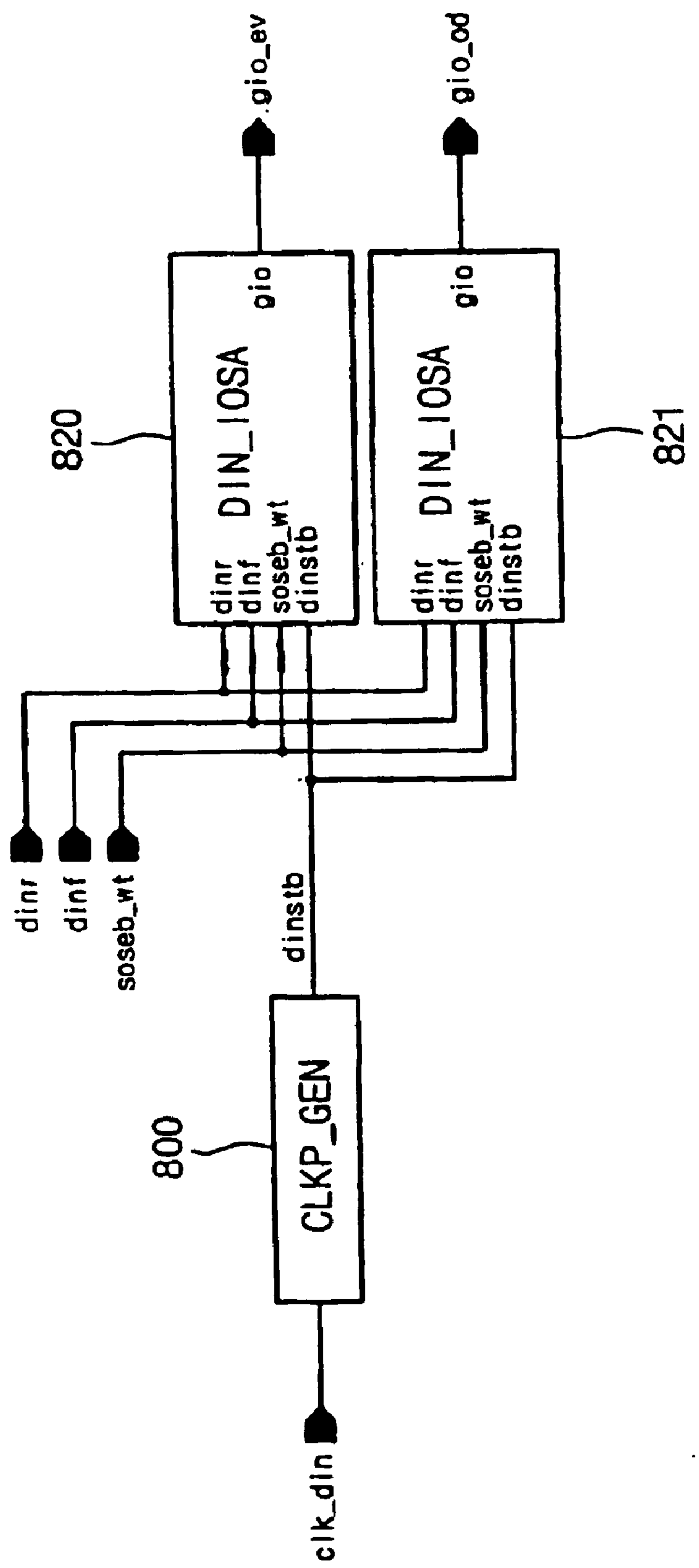
FIG. 8 is a block diagram of a data input device of a DDR SDRAM according to a second embodiment of the present invention.

FIG. 8 is a block diagram of a data input device of a DDR SDRAM according to the second embodiment of the present invention.

As shown in FIG. 8, the data input device according to the second embodiment of the present invention is provided with a clock pulse generator 800, and data buffers 820 and 821. The operation of the data input device according to the second embodiment of the present invention is identical to that according to the first embodiment of the present invention except that the function of the multiplexer used in the first embodiment is implemented in the data buffers 820 and 821.

Hereinafter, the operation of the data input device according to the second embodiment of the present invention will be explained.

Figure 3:
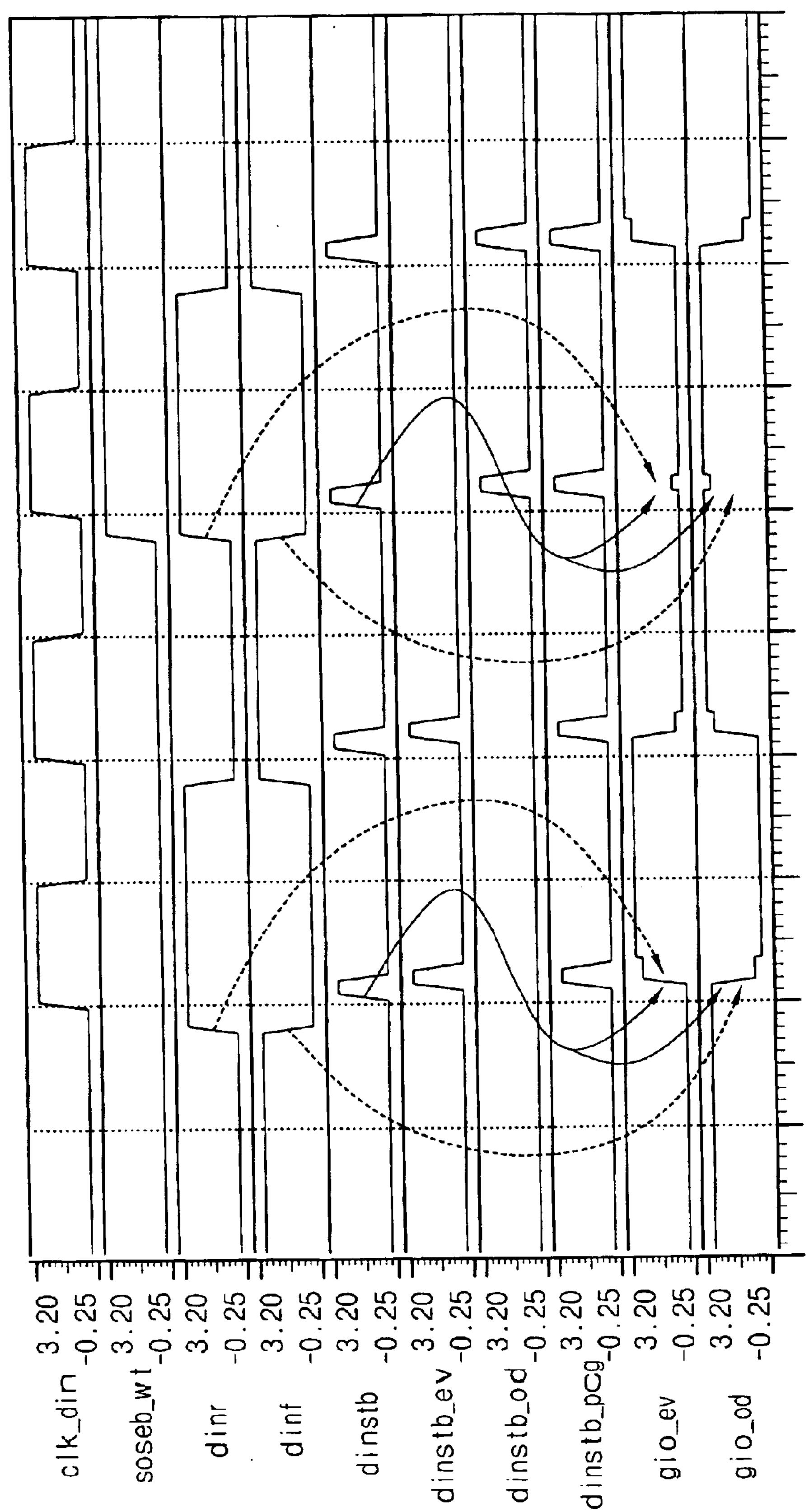
FIG. 3 is a waveform diagram of signals used in the data input device illustrated in FIG. 1.

Referring to FIG. 8, the clock pulse generator 800, which received the clock signal clk_din, outputs the data strobe pulse signal dinstb. The construction of the clock pulse generator 800 is almost the same as those of the clock pulse generators of FIGS. 1 and 3. The output signal dinstb of the clock pulse generator 800 is applied to the data buffers 820 and 821, and the data buffers 820 and 821 operate when the signal dinstb is in the high level (See FIG. 9).

The data buffers 820 and 821, as shown in FIG. 8, directly receive the rising data dinr, the falling data dinf, and the signal soseb_wt. The basic operation of the data input device according to the second embodiment is the same as that according to the first embodiment, and thus repeated explanation thereof will be omitted.

Figure 9:
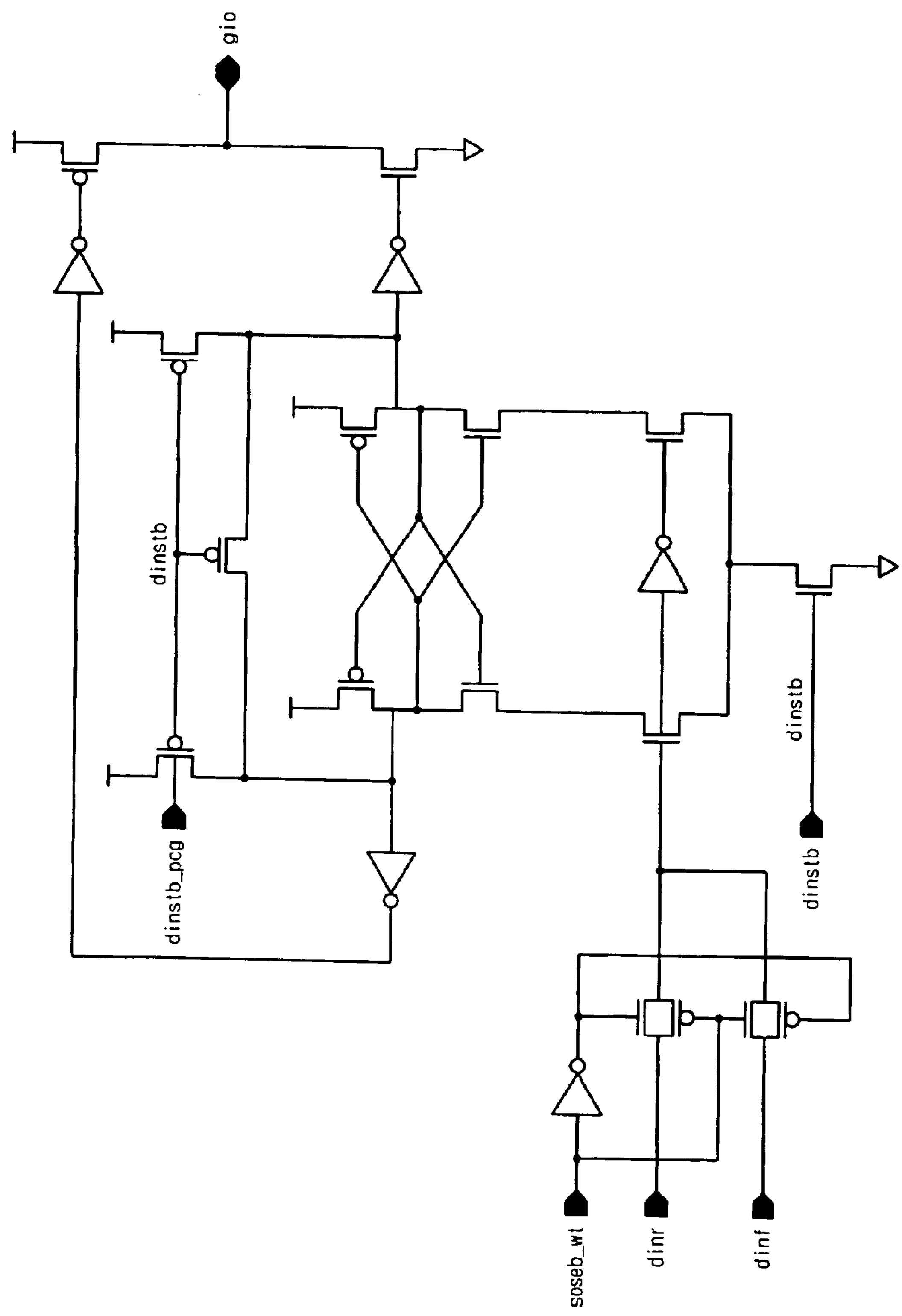
FIG. 9 is a circuit diagram illustrating the construction of the data buffer illustrated in FIG. 8 according to the second embodiment of the present invention.

FIG. 9 is a circuit diagram illustrating the construction of the data buffers 820 and 821 illustrated in FIG. 8 according to the second embodiment of the present invention.

In FIG. 9, for example, if the start address is the even address during the write operation, the signal soseb_wt is in a low-level state, the rising data dinr is transferred to the global input/output line gio_ev, and the falling data dinf is transferred to the global input/output line gio_od.

As described above, according to the data input device according to the first and second embodiment of the present invention, the time for the write operation can be reduced by directly applying the write-in-strobe signal, which is enabled in the write mode, to the data buffers. Also, in comparison to the related art data input device using the strobe signal generators, the layout area can be reduced by using a simple-constructed multiplexer.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A data input device of a DDR SDRAM comprising:

a clock pulse generator for outputting a data-in-strobe signal based on an internal clock in a write mode;

a first data buffer an being directly controlled by the data-in-strobe signal from the clock pulse generator and having an output line, which corresponds to a first global input/output line of the DDR SDRAM; and a second data buffer being directly controlled by the data-in-strobe signal from the clock pulse generator and having an output line, of which corresponds to a second global input-output line of the DDR SDRAM;

a multiplexer for receiving a first data, a second data, and a multiplexer control signal and determining, based on the multiplexer control signal, whether the first data is to be outputted to the first or second data buffer and whether the second data is to be outputted to the first or second data buffer, wherein if the multiplexer control signal is in a low level and the data-in-strobe signal is high, the first data is directly applied to the first data buffer to be transferred to the first global input/output line, and second data is directly applied to the second data buffer to be transferred to the second global input/output line; and wherein if the multiplexer control signal is in a high level and the data-in-strobe signal is high, the first data is directly applied to the second data buffer to be transferred to the second global input/output line, and the second data is directly applied to the first data buffer to be transferred to the first global input/output line.

2. The data input device of claim 1, wherein the multiplexer control signal outputs a low level if the least significant bit (LSB) of a column address applied in the write mode is “0”, and outputs a high level if the LSB of the column address applied in the write mode is “1”.

3. The data input device of claim 1, wherein the first data corresponds to 0 to even numbered data bursts from a sequence of data bursts, and wherein the second data corresponds to 1 to odd numbered data bursts from a sequence of data bursts.

4. The data input device of claim 3, wherein the first data buffer has only one data input terminal and selectively receives the first data or the second data through the data input terminal controlled directly by the data-in-strobe signal.

5. The data input device of claim 1 claim 3, wherein the second data buffer has only one data input terminal and selectively receives the first data or the second data through the data input terminal controlled directly by the data-in-strobe signal.

* * * * *